(12) United States Patent
Lee et al.

(10) Patent No.: US 8,791,582 B2
(45) Date of Patent: Jul. 29, 2014

(54) INTEGRATED CIRCUIT PACKAGE WITH VOLTAGE DISTRIBUTOR

(75) Inventors: Chu-Chung Lee, Round Rock, TX (US); Kian Leong Chin, Kuala Lumpur (MY); Kevin J. Hess, Round Rock, TX (US); Patrick Johnston, Austin, TX (US); Tu-Anh N. Tran, Austin, TX (US); Heng Keong Yip, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 566 days.

(21) Appl. No.: 12/844,922

(22) Filed: Jul. 28, 2010

(65) Prior Publication Data

US 2012/0025401 A1 Feb. 2, 2012

(51) Int. Cl.
*H01L 23/48* (2006.01)

(52) U.S. Cl.
USPC ........................................ 257/782

(58) Field of Classification Search
CPC ........... H01L 23/53238; H01L 2924/01079; H01L 2924/01013; H01L 2924/01029; H01L 2924/01078
USPC .......... 257/782, E23.023, 778–781, 784, 786, 257/691
See application file for complete search history.

(56) References Cited

U.S. PATENT DOCUMENTS

| | | |
|---|---|---|
| 5,060,052 A | 10/1991 | Casto et al. |
| 5,235,207 A | 8/1993 | Ohi et al. |
| 5,455,200 A | 10/1995 | Bigler |
| 5,514,912 A | 5/1996 | Ogashiwa |
| 5,631,191 A | 5/1997 | Durand et al. |
| 5,719,748 A | 2/1998 | Cullinan et al. |
| 5,872,403 A | 2/1999 | Bowman et al. |
| 6,083,772 A | 7/2000 | Bowman et al. |
| 6,114,751 A | 9/2000 | Kumakura et al. |
| 6,319,755 B1 | 11/2001 | Mauri |

(Continued)

FOREIGN PATENT DOCUMENTS

| | | |
|---|---|---|
| DE | 4430050 A1 | 2/1996 |
| EP | 0594299 A2 | 4/1994 |

(Continued)

OTHER PUBLICATIONS

Office action mailed on Mar. 8, 2010 in U.S. Appl. No. 11/732,594.
Office action mailed on Jun. 28, 2010 in U.S. Appl. No. 11/732,594.
Office action mailed on Jan. 14, 2011 in U.S. Appl. No. 12/599,625.
Office action mailed on Nov. 2, 2011 in U.S. Appl. No. 12/599,625.

*Primary Examiner* — Hoa B Trinh
(74) *Attorney, Agent, or Firm* — David G. Dolezal; James L. Clingan, Jr.

(57) ABSTRACT

An integrated circuit package includes a semiconductor die attached to a package support. The die has a plurality of peripheral bond pads along a periphery of the die and a first bond pad on an interior portion of the die wherein the first bond pad is a power supply bond pad. A conductive distributor is over the die and within a perimeter of the die and has a first opening. The plurality of bond pads are located between the perimeter of the die and a perimeter of the conductive distributor. The first bond pad is in the first opening. A first bond wire is connected between the first bond pad and the conductive distributor. A second bond wire is connected between a first peripheral bond pad of the plurality of peripheral bond pads and the conductive distributor.

17 Claims, 7 Drawing Sheets

(56) References Cited

U.S. PATENT DOCUMENTS

| | | |
|---|---|---|
| 6,784,525 B2 | 8/2004 | Kuan et al. |
| 6,836,009 B2 | 12/2004 | Koon et al. |
| 7,550,318 B2 | 6/2009 | Hess et al. |
| 2004/0018317 A1 | 1/2004 | Heinrich et al. |
| 2004/0183174 A1 | 9/2004 | Huang et al. |
| 2006/0091560 A1* | 5/2006 | Kang et al. ............ 257/777 |
| 2008/0146010 A1 | 6/2008 | Hosseini et al. |
| 2008/0246165 A1 | 10/2008 | Hess et al. |

FOREIGN PATENT DOCUMENTS

| | | |
|---|---|---|
| WO | 200510989 A1 | 7/2004 |
| WO | 2006020822 A2 | 8/2005 |
| WO | 2008139273 A1 | 5/2007 |

* cited by examiner

INTEGRATED CIRCUIT PACKAGE WITH VOLTAGE DISTRIBUTOR

BACKGROUND OF THE INVENTION

1. Field of the Invention

This invention relates in general to integrated circuit packages and more specifically to integrated circuit packages with voltage distributors.

2. Description of the Related Art

Integrated circuit die (also referred to as semiconductor die) are implemented in integrated circuit packages for use in electronic systems. Integrated circuit packages include one or more die and redistribution conductors (e.g. bond wires, conductive traces) that are encapsulated in an encapsulant. The redistribution conductors convey I/O signals and power supply voltages (e.g. VDD and Ground) between external circuitry and the encapsulated die. Examples of integrated circuit packages include BGA packages, leaded packages, leadless packages, flip chip packages, and QFN packages.

One problem with integrated circuit packages is distributing supply voltages to the die without incurring excessive voltage drop. Because the power supply conductors typically carry the highest amount of current, they are most susceptible to voltage drop if the conductors have high resistivity.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale. For example, the width to height ratios of the structures shown in the Figures may be skewed in order to more clearly illustrate aspects of the present invention.

DETAILED DESCRIPTION

The following sets forth a detailed description of a mode for carrying out the invention. The description is intended to be illustrative of the invention and should not be taken to be limiting.

As described herein, an integrated circuit package includes a voltage distributor attached to an encapsulated die for providing power supply current to interior power bond pads of the die. The distributor can be compact and fit within a particular area of the die for ease and reliability of attachment. In one embodiment, the distributor includes openings for wire bonding to the interior pads of the die.

Figure 1:
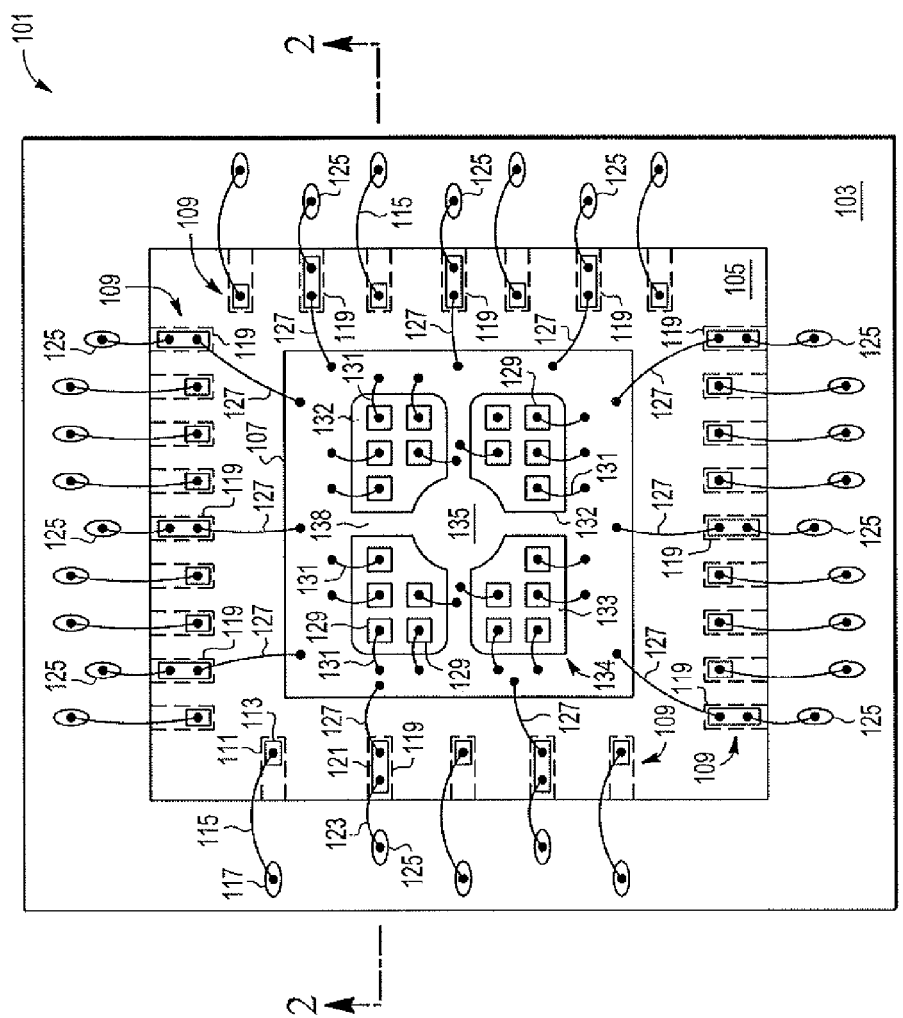
FIG. 1 sets forth a top view of an integrated circuit package according to one embodiment of the present invention.
Figure 2:
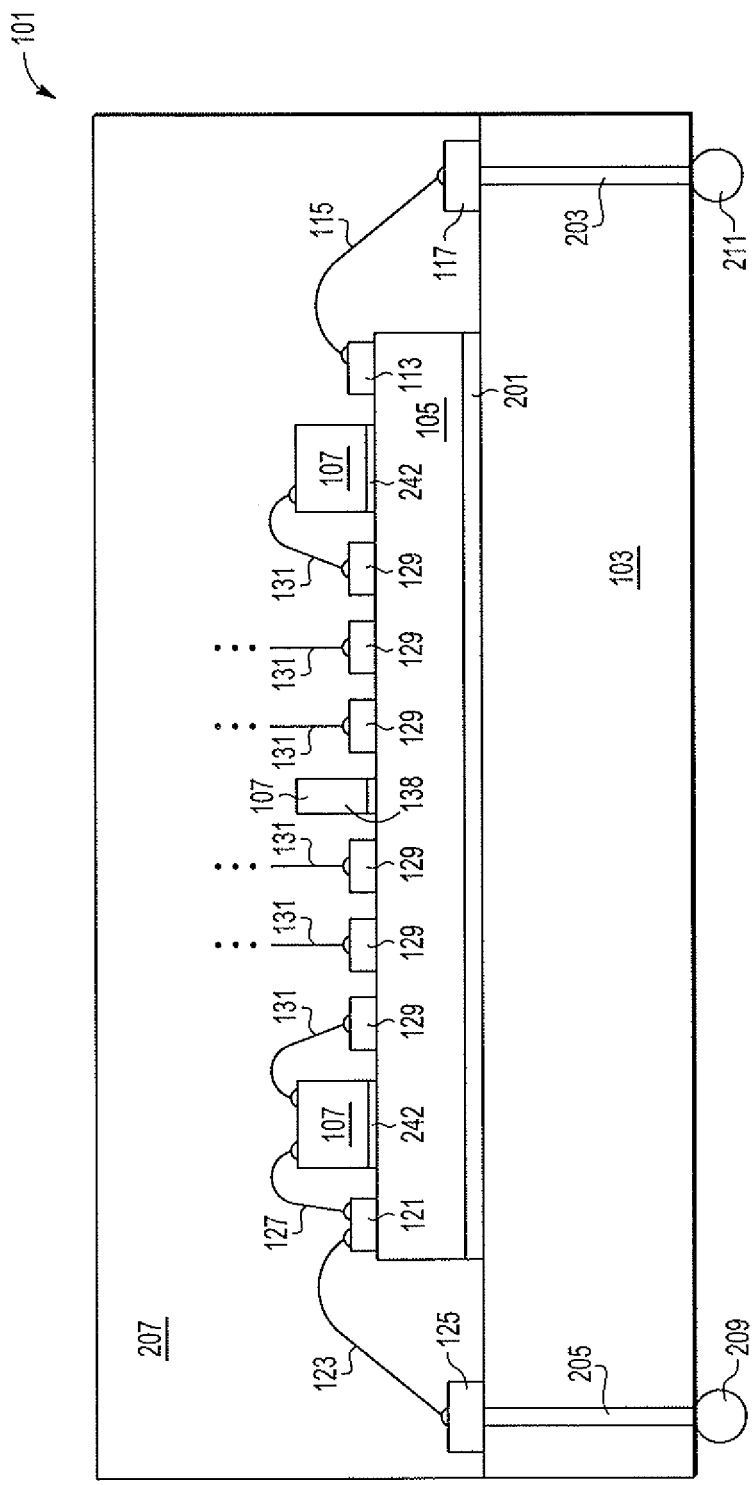
FIG. 2 sets forth a cutaway side view of an integrated circuit package according to one embodiment of the present invention.

FIG. 1 is a top view of an integrated circuit package 101 according to one embodiment of the present invention. FIG. 2 shows a side cutaway view of package 101. In the view of FIG. 1, an encapsulant (207 in FIG. 2) that covers the top side of package 101 is not shown in order to illustrate the bond pads, bond posts, bond wires, and voltage distributor of package 101.

In the embodiment shown, a die 105 is attached to a BGA substrate 103. BGA substrate 103 includes non conductive material (e.g. clad material or pre-preg material, such as epoxy/glass FR4 or BT resin or the like) with I/O bond posts 117 and power supply bond posts 125 located on the top side of substrate 103. Solder balls (e.g. 209 and 211 as shown in FIG. 2) are located on the bottom side (not shown in FIG. 1) of substrate 103. Substrate 103 includes conductive structures such as traces and through vias (205 and 203 of FIG. 2) that electrically couple the bond posts (125 and 117) to the solder balls (209 and 207). Bond posts 117 and 125 are wire bonding surfaces of substrate 103. In some embodiments, the BGA substrate includes multiple layers of conductive structures and vias.

Die 105 is attached to substrate 103 with an adhesive structure (e.g. 201 of FIG. 2). In one embodiment, the die includes an integrated circuit formed from a wafer (not shown) of processed semiconductor, non conductive, and conductive materials. After formation, the wafer is then singulated into individual die. The top side of die 105 includes I/O pads 113, peripheral power supply bond pads 121, and interior power supply bond pads 129. The I/O pads 113 are located in I/O cells 111 (shown in dashed lines in FIG. 1) located on the periphery of die 105. An I/O cell includes the I/O pad 113 as well as other internal circuitry (e.g. input/output buffers, ESD protection circuitry) for conveying I/O signals to and from the integrated circuit of die 105. An "I/O pad" is a pad that can convey an input signal only, an output signal only, or an input and output signal. Likewise an "I/O cell" is a cell that includes circuitry that conveys input signals only, output signals only, or input and output signals.

The peripheral power supply pads 121 are located in peripheral power supply cells 119 located at the periphery of die 105. In one embodiment, power supply cells 119 may include ESD protection circuitry or may include a coupling to a power supply interconnect located at internal interconnect layers of die 105. In the embodiment shown, peripheral power supply cells 119 and I/O cells 111 are located in an I/O ring 109 around the periphery of die 105. In the embodiment shown, I/O ring 109 is located on all four sides of die 105. In other embodiments, the I/O ring is located on a lesser number of sides. Also in other embodiments, a semiconductor die may include a lesser or greater number of pads arranged in other configurations.

I/O bond pads 113 and peripheral power supply pads 121 are wire bonded to substrate I/O posts 117 and power supply substrate posts 125, respectively for conveying signals and power supply voltages between die 105 and the solder balls (211 and 209) on the bottom side of the package 101. Bond wires 115 and 123 (as well as other bond wires shown in FIG. 1) are made of a conductive material (e.g. gold, copper, aluminum) and are bonded to a pad or substrate post by a wire bonding technique (e.g. ultrasonic bonding, wedge bonding, ball bonding, thermo compression bonding).

Die 105 also includes a number of interior power supply pads 129 located in the interior of the die. Interior power supply pads 129 are electrically coupled to interconnects located in the metal layers of die 105 for conveying power supply voltages to interior transistors located in die 105. Interior power supply pads 129 may also be located in power supply cells that may include other circuitry such as ESD protection circuitry. Each interior power supply pad and peripheral power supply pad serves as a power supply terminal for die 105.

In order to reduce the resistance between the power interconnects located at the periphery of die 105 and the power interconnects located at an interior portion of die 105, package 101 includes a voltage distributor 107 attached to the top surface of die 105. In one embodiment, voltage distributor 107 is attached to die 105 with double sided adhesive tape (see tape 242 in FIG. 2) but may be attached by other techniques in other embodiments. Voltage distributor 107 includes conductive material for conveying power supply voltages to interior pads 129 from peripheral pads 121. In one embodiment, distributor 107 is made of copper, a copper alloy, a nickel-iron alloy (e.g. Alloy 42) but may be made of other conductive materials in other embodiments. In another embodiment, the distributor is made of conductive traces embedded in an insulative board (e.g. a circuit board such as FR4 or BT) with bond posts formed on the top surface. Distributor 107 includes wire bonding surfaces for attaching bond wires 127 to peripheral power supply pads 121 and for attaching bond wires 131 to interior power supply pads 129.

In one embodiment, distributor 107 is made from a sheet of conductive material having a thickness in the range of 10 to 50 microns, but may be of other thicknesses in other embodiments. The thicknesses may be adjusted to provide the desired resistance of the distributor. In one embodiment, distributor 107 has a width and length in the range of 2 to 15 mm, or more preferably a width and length in the range of 4 to 10 mm, but may have other widths and ranges in other embodiments depending upon the desired size of the die and I/O ring.

Distributor 107 includes four openings 132 for exposing the interior power supply pads 129 for wire bonding to distributor 107 with bond wires 131. In one embodiment, interior power supply pads 129 are located over a core area of the die. In the embodiment shown, the open areas are defined by rounded corners except for corner 134 which is square to provide an indication of orientation of the distributor 107 with respect to die 105. Distributors of other embodiments may have a greater or lesser number of openings. In other embodiments, the openings may be arranged in different patterns.

Distributor 107 includes an interior portion 135 that includes a continuous surface that is large enough for a suction tool to pick up the distributor to place it on die 105. In one embodiment, portion 135 has a continuous solid surface with a diameter of at least 1 to 1.5 millimeters, depending on the size of the vacuum pick up tool. In one embodiment, the pick up tool is also suitable for picking up die. The center portion 135 is connected to the outer portion of distributor 107 by arms 138 which define the openings 132. The arms have a width that is less than the diameter of the interior portion.

FIG. 2 is a cutaway side view of package 101. FIG. 2 shows encapsulant 207, solder balls 209 and 211, and conductive through hole vias 205 and 203. Die 105 is attached to substrate 103 with adhesive structure 201. In one embodiment, adhesive structure 201 may include a tape. In other embodiments, the die may be attached to substrate 103 though other intervening structures.

In the embodiment shown, an electrical coupling from bond pad 129 to solder ball 209 is made from through hole via 205, substrate power post 125, bond wire 123, peripheral power supply pad 121, bond wire 127, distributor 107, and bond wire 131.

In the embodiment shown, distributor 107 provides for a lower resistance path between the peripheral power supply pads 121 and the interior pads 129. If distributor 107 were not present, then the power supply current would have to be supplied to interior portions of die 105 via interconnects located in die 105. Because those interconnects are typically narrow (25 microns or less, typically 1 micron or less) and thin (3 microns or less in thickness, typically 1 micron or less), power supply currents may generate a significant voltage drop from the peripheral regions to interior regions of the die. One alternative approach for connecting the peripheral power supply pads to the interior pads is to wire bond the peripheral power supply pads directly to the interior pads. However, the voltage drop along the wire bonded wires is still high due to the small cross-sectional area of the wire. Accordingly, providing a voltage distributor reduces the amount of voltage drop in the power distribution system for a die.

Also as shown in FIG. 1, the surface area defined by the perimeter of distributor 107 is less than the top surface of die 105. This allows for an easier installation of the distributor as opposed to a distributor that extends out past the die. Further, reducing the surface area defined by the perimeter of distributor 107 also reduces the effects of package stresses on the package as opposed to a larger distributor.

The distributor 107 is coupled to the substrate posts 125 via bond wires 127, bond pad 121, and bond wire 123. Accordingly, portions of the distributor are not required to be connected to the substrate 103. By not requiring that structures of the distributor to be connected to the substrate 103, the complexity of package assembly can be reduced in that no external conductive structures (as such as "lead on chip" structures) have to be attached to the substrate 103 and die 105. With the embodiment shown, the electrical coupling of the power supply voltage between the substrate 103 and die 105 is made with bond wires thereby reducing the complexity of assembly as opposed to using a solid conductive structure for substrate to die power supply coupling.

Also, because in the embodiment shown, bond wires 123 are bonded to peripheral power supply pads 121 and not to the distributor 107, the bond wires 123 are of a reduced length. Keeping the bond wires 123 to a reduced length and wire bonding to the peripheral bond pads helps reduce the voltage drop along the bond wires and also helps reduce problems associated with wire bond sweep.

In the embodiment shown, integrated circuit package 101 is a ball grid array (BGA) package in which a BGA substrate 103 is used as a package support. However, voltage distributors may be implemented in other types of integrated circuit packages such as leaded packages, leadless packages, flip chip packages, and QFN packages. These other types of packages may include other types of package supports such as a lead frame in a leaded package.

Figure 3:
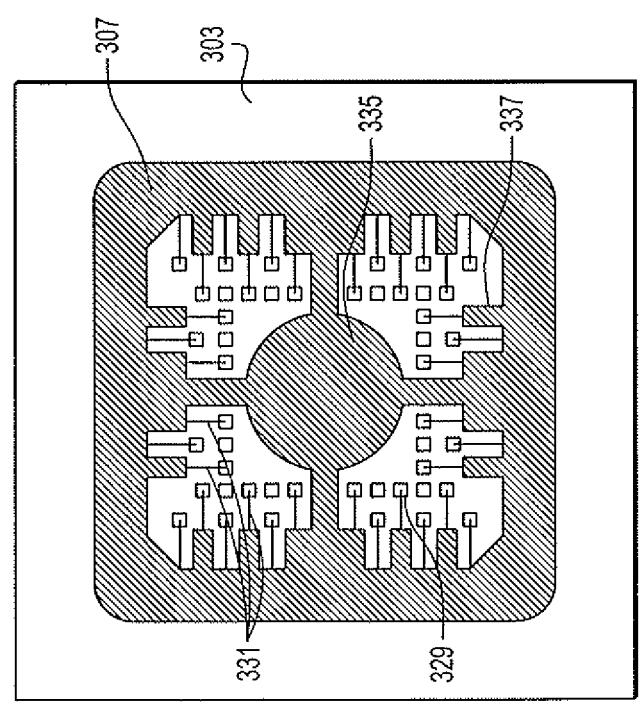
FIG. 3 shows a top view of a voltage distributor attached to a die according to one embodiment of the present invention.

In other embodiments, a distributor may have different shapes and features. FIG. 3 shows a top view of a die 303 and distributor 307. Also shown in FIG. 3 are interior power supply pads 329 and bond wires 331. Peripheral die pads and bond wires to the peripheral pads are not shown in FIG. 3. In the embodiment shown, distributor 307 includes tabs 337 that extend from an outer portion of distributor 307 into the openings for bond wire attachment. Adding tabs may increase the available interior area for power supply pads and reduce the length of some bond wires. However, the use of tabs may cause encapsulating problems in that the encapsulant may not completely fill in the regions between the tabs or that the tabs may create a region of higher local stress. Either condition might possibly lead to separation between the encapsulant and the top surface of the die.

Figure 4:
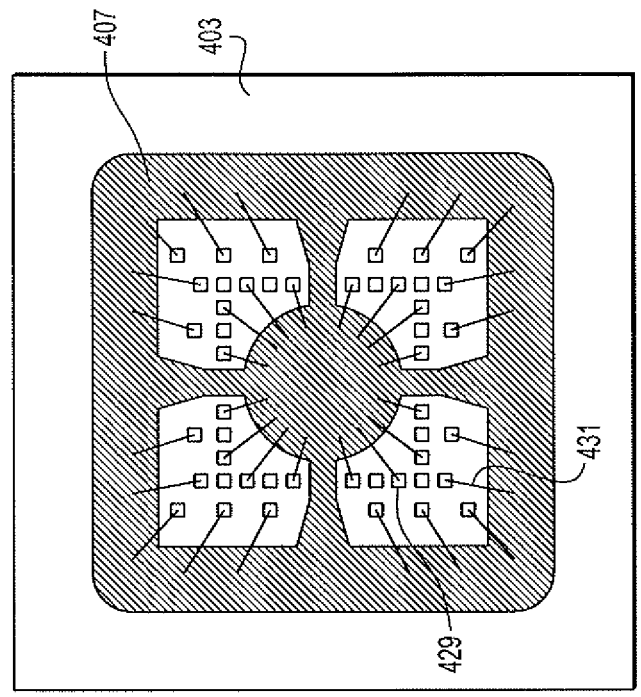
FIG. 4 shows a top view of a voltage distributor attached to a die according to one embodiment of the present invention.

FIG. 4 shows a top view of a die 403 with another type of distributor 407 according to another embodiment of the present invention. In FIG. 4, distributor 407 is attached to die 403. Interior power supply bond pads 429 are coupled to distributor 407 by bond wires 431. Not shown in FIG. 4 are peripheral bond pads, and bond wires to the peripheral bond pads. Distributor 407 lacks the tabs that distributor 307 has, which may mean in some embodiments, longer bond wires but less encapsulating problems associated with the tabs.

Figure 5:
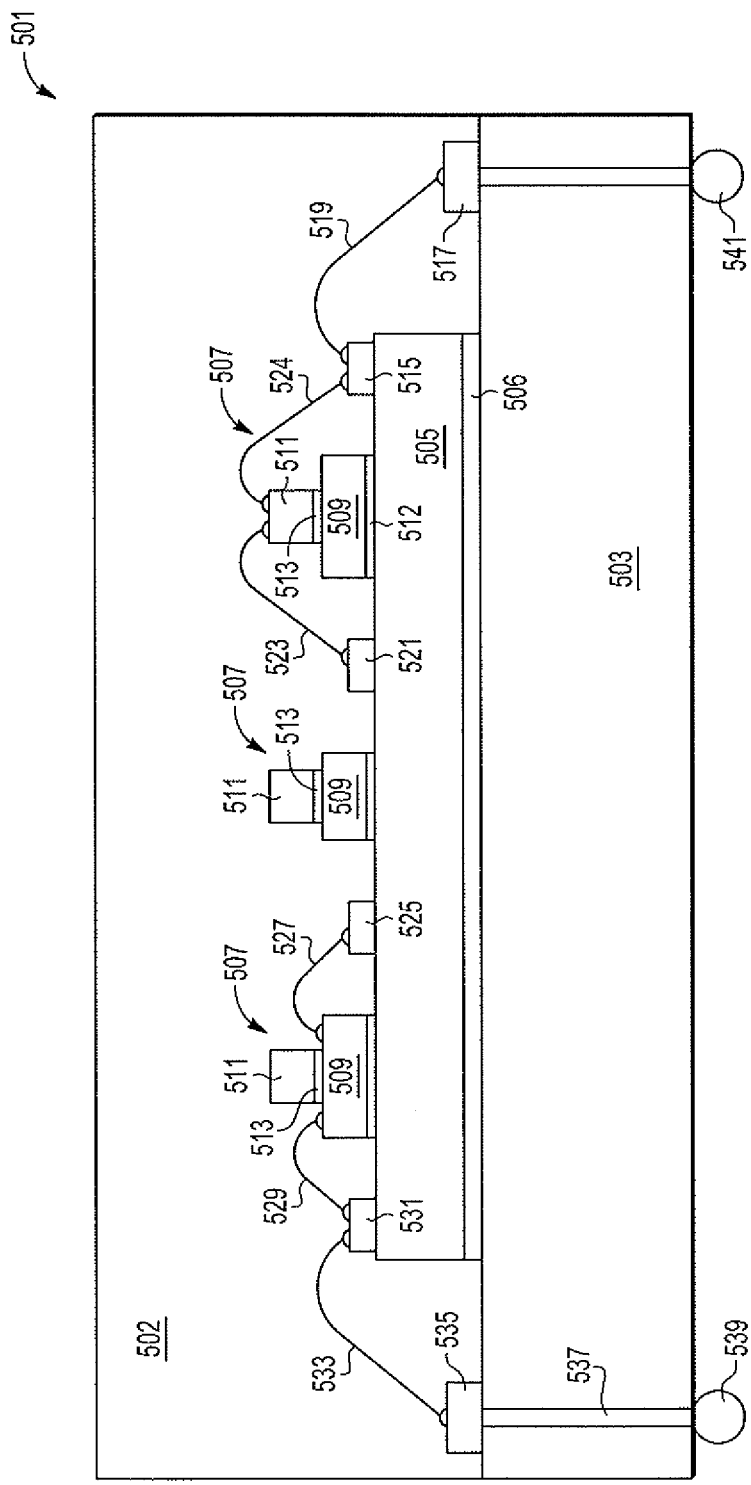
FIG. 5 is a cutaway side view of an integrated circuit package according to one embodiment of the present invention.
Figure 6:
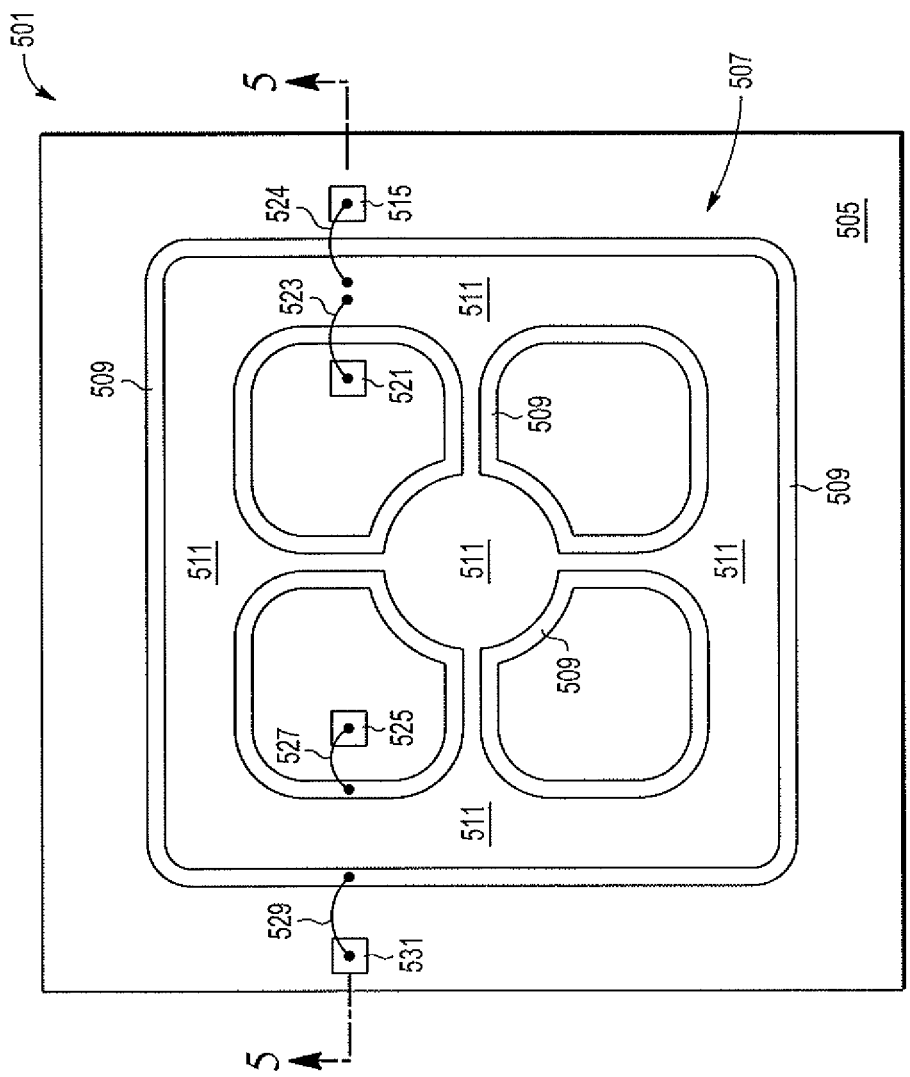
FIG. 6 is a top view of an integrated circuit package according to one embodiment of the present invention.

FIGS. 5 and 6 set forth side and top views, respectively, of a multilevel distributor according to one embodiment of the present invention. Referring to FIG. 5, a distributor 507 is attached to die 505 with adhesive structure 512. Distributor 507 includes two conductive layers, layer 509 and layer 511. Layer 511 is attached to layer 509 with insulative adhesive structure 513. Each of layers 509 and 511 is made of a layer of conductive material (e.g. copper, coppery alloy, aluminum) and is used to distribute a different power supply voltage (e.g. 5 volts, 1 volt, ground, −1 volt) for different power supply voltage domains of the die. Layer 511 has a narrower width as opposed to layer 509 to allow for wire bonding to the top of layer 509. In one embodiment, one power supply voltage domain is a positive voltage domain and the other voltage domain is ground.

Die 505 is attached to BGA substrate 503 with adhesive structure 506. Die 505 includes peripheral power supply pads 531 of a first power supply voltage domain and peripheral power supply pads 515 of a second power supply voltage domain. Die 505 also includes interior power supply pads 525 of the first supply voltage domain and interior power supply pads 521 of the second power supply voltage domain.

The power supply pads 531 and 525 of the first power supply voltage domain are wire bonded to the lower conductive layer 509 of distributor 507 with bond wires 529 and 527 respectively. Power supply pads 521 and 515 of the second power supply voltage domain are wire bonded to the upper conductive layer 511 with bond wires 523 and 524, respectively. Layer 511 is at a reduced width with respect to layer 509. Bond wire 533 is connected to power supply post 535 of substrate 503. Post 535 is coupled to solder ball 539 by through hole via 537. Bond wire 519 is connected to substrate post 517. Post 517 is coupled to solder ball 541. The die, bond wires, distributor, and substrate are encapsulated with encapsulant 502.

FIG. 6 shows a top view of die 505 with encapsulant 502 removed. Also not shown in FIG. 6 are other interior power supply pads of die 505, peripheral power supply pads of die 505, I/O pads of die 505, bond posts of substrate 503, and all other bond wires. As shown in FIG. 6, the edge of layer 509 extends out further than the edge of layer 511 to allow for wire bonding to the top of layer 509.

An advantage of a multilevel distributor 507 is that it provides for multiple voltages to be provided to interior power supply bond pads for multiple power supply voltage domains. It also provides for a multi voltage distributor that is more rigid allowing for ease of installation.

In other embodiments, the multilevel distributor may be made with multiple conductors embedded in a glass-reinforced/resin board (e.g. FR4 or BT circuit board) with bonding areas defined on the top surface and traces routing power and ground to bond pads for connection of the interior power supply bond pads of the die.

In other embodiments, a multilevel distributor may have more than two levels for providing more than two voltages.

Also in other embodiments, the different levels may have different shapes. For example, the top level may not be present in some areas.

Figure 7:
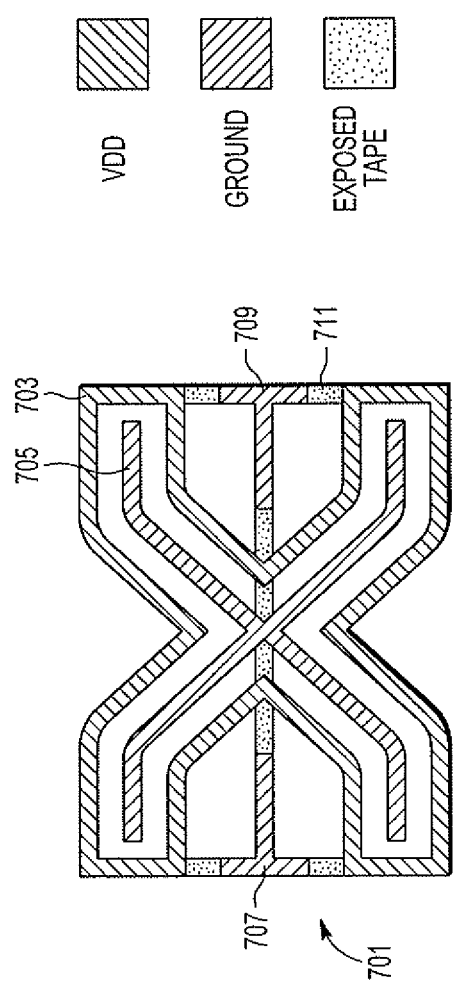
FIG. 7 is a top view of a voltage distributor according to one embodiment of the present invention.

FIG. 7 shows a top view of an interleaved distributor according to one embodiment of the present invention. An interleaved distributor 701 is a distributor having power supply conductors for different voltages on the same level. In FIG. 7, the VDD conductor 703 is shaded with lines of one direction and the ground conductors 705, 707, and 709 are shaded with lines of a different direction. In the embodiment shown, the VDD conductor and the ground conductors are electrically and physically isolated from each other. Interior ground conductor 705 is physically separate from ground conductors 707 and 709. These conductors may be coupled together with bond wires or wire bonded to the same pads when implemented in a package.

Distributor 701 includes adhesive tape that is located on the back side of all conductor portions and also extends between conductor portions as shown by the shaded parts. The tape of the shaded parts holds the isolated conductive portions together during its application to a die. In some embodiment, an interleaved distributor may include a surface for a vacuum tool attachment. Interleaved distributors may have different configurations in different embodiments. The shape and patterns of the conductors of the distributor is dependent upon the layout of the bond pads. In some embodiments, an interleaved distributor may have more voltage conductors or may have conductors for more than two power supply voltages.

Figure 8:
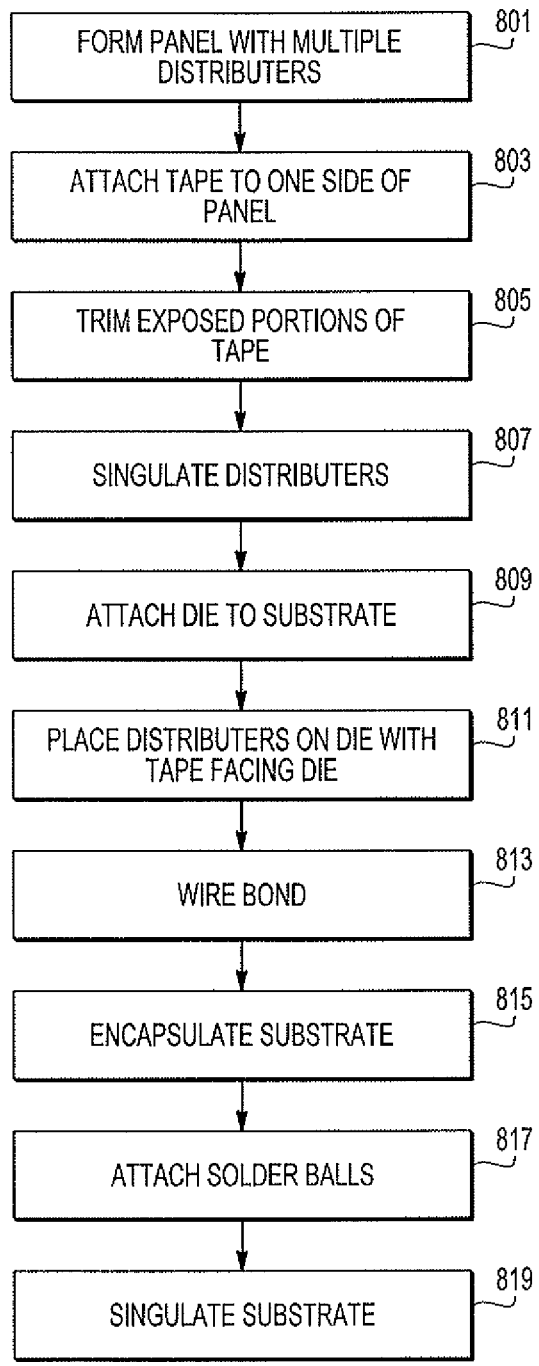
FIG. 8 is a flow diagram illustrating operations in forming an integrated circuit package according to one embodiment of the present invention.

FIG. 8 sets forth a flow diagram for a method of forming an integrated circuit package according to one embodiment of the present invention. In the embodiment shown, the integrated circuit package formed is a BGA integrated circuit package that includes a distributor similar to distributor 107. However, one of skill in the art, based upon the teachings herein could modify the process to produce other types of integrated circuit packages and/or that include other types of distributors.

In operation 801, a panel with multiple distributors is formed from a sheet of conductive material. In one embodiment, the sheet of conductive material is stamped, etched or cut to form multiple distributors. The distributors include openings 132 and slots between the distributors. The multiple distributors are coupled by tie bars that will be cut during subsequent singulation.

In operation 803, a two sided adhesive tape (e.g. 142) is applied to one side of the panel. In operation 805, the tape is then cut from the other side of the panel such that no exposed tape from the other side of the panel remains after trimming. In other embodiments, a precut tape may be applied to the panel where the precut tape includes openings corresponding to the openings of the panel.

In operation 807, the panel is singulated into the individual distributors. In one embodiment, the panel is placed on a wafer dicing tape. A wafer saw then cuts the panel into individual distributors.

In operation 809, die are attached to a BGA substrate or other package support. The BGA substrate includes portions for multiple packages where each portion has at least one die attached to the portion. This operation may be performed currently or before operations 801 to 807.

In operation 811, the distributors are attached on top of the die of the BGA substrate with the 2 sided adhesive tap. The placement of the distributors may be performed with a vacuum placement tool.

In operation 813, the pads and distributors are wire bonded at the appropriate locations.

In operation 815, the BGA substrate with the die and bond wires are encapsulated to form and encapsulated panel. In operation 817, solder balls are attached to the panel. In operation 819, the panel is singulated into individual integrated circuit packages.

In one embodiment, an integrated circuit package includes a package support and a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die. The integrated circuit package includes a conductive distributor over the semiconductor die. The conductive distributor is within a perimeter of the semiconductor die and the plurality of peripheral bond pads are located between the perimeter of the semiconductor die and a perimeter of the conductive distributor, the conductive distributor has a first opening, and the first bond pad is in the first opening. The integrated circuit package includes a first bond wire connected to the first bond pad and the conductive distributor and a second bond wire connected to a first peripheral bond pad of the plurality of peripheral bond pads and the conductive distributor.

In another embodiment, an integrated circuit package includes a package support and a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die. The integrated circuit package includes a first conductive distributor over a first portion of the semiconductor die and contained within a perimeter of the semiconductor die, a first bond wire connected to the first bond pad and the first conductive distributor, and a second bond wire connected to a first peripheral bond pad of the plurality of peripheral bond pads and the first conductive distributor.

Another embodiment includes a method of forming an integrated circuit package. The method includes attaching a semiconductor die to a package support, attaching a conductive distributor with an adhesive structure to the semiconductor die, wire bonding a first plurality of bond pads on a periphery of the semiconductor die and a second plurality of bond pads on an interior portion of the semiconductor die to the conductive distributor, and encapsulating the semiconductor die, the conductive distributor, and at least a portion of a top surface of the package support.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit package, comprising:
    a package support;
    a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die;
    a conductive distributor over the semiconductor die, wherein:
        the conductive distributor is within a perimeter of the semiconductor die;
        the plurality of peripheral bond pads are located between the perimeter of the semiconductor die and a perimeter of the conductive distributor;
        the conductive distributor has a first opening, and
        the first bond pad is in the first opening;
    a first bond wire connected to the first bond pad and the conductive distributor; and
    a second bond wire connected to a first peripheral bond pad of the plurality of peripheral bond pads and the conductive distributor.

2. The integrated circuit package of claim 1, further comprising:
    a third bond wire and a fourth bond wire;
    wherein:
        the conductive distributor has a first conductive layer, a second conductive layer over the first conductive layer and recessed from the first conductive layer, and an insulator separating the first conductive layer and the second conductive layer;
        the semiconductor die further comprises a second bond pad in the first opening, wherein the second bond pad is a bond pad for a second power supply voltage domain of the semiconductor die;
        the first bond wire is connected to the first conductive layer;
        the second bond wire is connected to the first conductive layer;
        the third bond wire is connected between the second conductive layer and the second bond pad; and
        the fourth bond wire is connected between the second conductive layer and a second peripheral bond pad of the plurality of peripheral bond pads.

3. The integrated circuit package of claim 2, wherein the first power supply voltage domain is a positive power supply voltage and the second power supply voltage domain is ground.

4. The integrated circuit package of claim 2, wherein:
    the conductive distributor has a second opening;
    the semiconductor die further comprises a third bond pad in the second opening, wherein the third bond pad is a bond pad for the first power supply voltage domain;
    the semiconductor die further comprises a fourth bond pad in the second opening, wherein the fourth bond pad is a bond pad for the second power supply voltage domain; and
    the integrated circuit package further comprises:
        a fifth bond wire connected to the first conductive layer and the third bond pad; and
        a sixth bond wire connected to the second conductive layer and the fourth bond pad.

5. The integrated circuit package of claim 2, wherein:
    the semiconductor die further comprises a third bond pad in the first opening, wherein the third bond pad is a bond pad for the first power supply voltage domain;
    the semiconductor die further comprises a fourth bond pad in the first opening, wherein the fourth bond pad is a bond pad for the second power supply voltage domain; and
    the integrated circuit package further comprises:
        a fifth bond wire connected to the first conductive layer and the third bond pad; and
        a sixth bond wire connected to the second conductive layer and the fourth bond pad.

6. The integrated circuit package of claim 1, further comprising:
a third bond wire;
wherein:
the semiconductor die further comprises a second bond pad in the first opening, wherein the second bond pad is a bond pad for the first power supply voltage domain; and
the third bond wire is connected between the second bond pad and the conductive distributor.

7. The integrated circuit package of claim 1, further comprising a third bond wire connected between a second peripheral bond pad of the plurality of peripheral bond pads and the conductive distributor.

8. The integrated circuit package of claim 1, further comprising:
a third bond wire;
wherein:
the conductive distributor has a second opening;
the semiconductor die further comprises a second bond pad in the second opening; and
the third bond wire is connected between the conductive distributor and the second bond pad.

9. The integrated circuit package of claim 1 wherein:
the conductive distributor is an interleaved distributor and includes a first conductive structure of the first power supply voltage domain and a second conductive structure of a second power supply voltage domain of the semiconductor die;
the first bond wire and the second bond wire are connected to the first conductive structure;
the integrated circuit package includes a third bond wire and a fourth bond wire;
the interleaved distributor has a second opening;
the semiconductor die further comprises a second bond pad in the second opening in the interleaved distributor;
the third bond wire is connected between the second conductive structure of the second power supply voltage domain and the second bond pad; and
the fourth bond wire is connected between the second conductive structure of the second power supply voltage domain and a second peripheral bond pad of the plurality of peripheral bond pads.

10. The integrated circuit package of claim 1 wherein:
the package support includes a plurality of wire bonding surfaces;
no bond wire of the integrated circuit package is connected to both a wire bonding surface of the package support and the conductive distributor.

11. The integrated circuit package of claim 1 further comprising:
a third bond wire, the third bond wire connected to the first peripheral bond pad and a wire bonding surface of the package support.

12. The integrated circuit package of claim 1 wherein the conductive distributor includes an outer portion, a center portion, and a plurality of arms connecting the outer portion to the center portion, wherein the first opening is defined by the outer portion, the center portion and two arms of the plurality of arms.

13. The integrated circuit package of claim 1 wherein the conductive distributor includes a center portion having a continuous surface area, the continuous surface area is large enough to contain a geometric circle having a diameter in the range of 1 to 1.5 millimeters.

14. An integrated circuit package, comprising:
a package support;
a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die;
a first conductive distributor over a first portion of the semiconductor die and contained within a perimeter of the semiconductor die,
a first bond wire connected to the first bond pad and the first conductive distributor; and
a second bond wire connected to a first peripheral bond pad of the plurality of peripheral bond pads and the first conductive distributor;
a third bond wire, the third bond wire connected to the first peripheral bond pad;
a wire bonding surface of the package support, wherein the third bond wire is connected to the wire bonding surface.

15. An integrated circuit package, comprising:
a package support;
a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die, wherein the semiconductor die has a second bond pad in the interior portion and wherein the second bond pad is a bond pad for a second power supply voltage domain of the semiconductor die;
a first conductive distributor over a first portion of the semiconductor die and contained within a perimeter of the semiconductor die,
a first bond wire connected to the first bond pad and the first conductive distributor;
a second bond wire connected to a first peripheral bond pad of the plurality of peripheral bond pads and the first conductive distributor;
a second conductive distributor over a second portion of the semiconductor die and contained within a perimeter of the semiconductor die;
a third bond wire connected between the second bond pad and the second conductive distributor; and
a fourth bond wire connected between a second peripheral bond pad of the plurality of peripheral bond pads and the second conductive distributor.

16. An integrated circuit package, comprising:
a package support;
a semiconductor die attached to the package support, wherein the semiconductor die has a plurality of peripheral bond pads along a periphery of the semiconductor die and a first bond pad on an interior portion of the semiconductor die, wherein the first bond pad is a bond pad for a first power supply voltage domain of the semiconductor die wherein the semiconductor die has a second bond pad in the interior portion and wherein the second bond pad is a bond pad for a second power supply voltage domain of the semiconductor die;
a first conductive distributor over a first portion of the semiconductor die and contained within a perimeter of the semiconductor die,
a first bond wire connected to the first bond pad and the first conductive distributor; and
a second bond wire connected to a first peripheral bond pad of the plurality of peripheral bond pads and the first conductive distributor;

a second conductive distributor over the first conductive distributor, insulated from the first conductive distributor, and setback from the first conductive distributor, a third bond wire connected between the second bond pad and the second conductive distributor; and a fourth bond wire connected between a second peripheral bond pad of the plurality of peripheral bond pads and the second conductive distributor.

17. The integrated circuit package of claim 14 wherein:

the package support includes a plurality of wire bonding surfaces, the plurality of wire bonding surfaces includes the wire bonding surface;

no bond wire of the integrated circuit package is connected to both a wire bonding surface of the package support and the first conductive distributor.

\* \* \* \* \*